US008416907B2

(12) United States Patent
Aziz et al.

(10) Patent No.: US 8,416,907 B2
(45) Date of Patent: Apr. 9, 2013

(54) METHOD AND APPARATUS FOR INTEGRAL STATE INITIALIZATION AND QUALITY OF LOCK MONITORING IN A CLOCK AND DATA RECOVERY SYSTEM

(75) Inventors: Pervez M. Aziz, Dallas, TX (US); Gregory W. Sheets, Breinigsville, PA (US); Vladimir Sindalovsky, Perkasie, PA (US)

(73) Assignee: Agere Systems LLC, Allentown, PA (US)

( * ) Notice: Subject to any disclaimer, the term of this patent is extended or adjusted under 35 U.S.C. 154(b) by 343 days.

(21) Appl. No.: 12/846,390

(22) Filed: Jul. 29, 2010

(65) Prior Publication Data
US 2010/0290513 A1    Nov. 18, 2010

Related U.S. Application Data

(62) Division of application No. 11/414,521, filed on Apr. 28, 2006, now Pat. No. 7,792,234.

(51) Int. Cl.
*H04L 7/00* (2006.01)
*H04L 25/00* (2006.01)
*H04L 25/40* (2006.01)

(52) U.S. Cl. ........ 375/372; 375/371; 375/373; 375/376; 327/159; 327/147

(58) Field of Classification Search .................. 375/372, 375/371, 373, 376, 326, 327; 327/156, 159, 327/147
See application file for complete search history.

(56) References Cited

U.S. PATENT DOCUMENTS

| 5,448,598 | A | 9/1995 | Yousefi et al. ................ 375/376 |
| 7,127,017 | B1 * | 10/2006 | Evans et al. .................... 375/355 |
| 7,187,743 | B2 | 3/2007 | Sachse et al. ................. 375/376 |
| 2006/0083339 | A1 | 4/2006 | Aziz et al. | |

* cited by examiner

*Primary Examiner* — Phuong Phu
(74) *Attorney, Agent, or Firm* — Ryan, Mason & Lewis, LLP

(57) ABSTRACT

Methods and apparatus are provided for improving the performance of second order CDR systems. The integral state of the CDR system is initialized to a value that is based on an expected frequency profile that may be known a priori for certain applications. One or more quality of lock (QOL) metrics are also monitored that are derived from the integral register state value. A quality of a locking between a received signal and a local clock generated by a Clock and Data Recovery (CDR) system is evaluated by monitoring a state value of an integral register in a digital loop filter of the CDR system; evaluating one or more predefined criteria based on the integral register state value; and identifying a poor lock condition if the one or more predefined criteria are not satisfied.

16 Claims, 3 Drawing Sheets

METHOD AND APPARATUS FOR INTEGRAL STATE INITIALIZATION AND QUALITY OF LOCK MONITORING IN A CLOCK AND DATA RECOVERY SYSTEM

CROSS-REFERENCE TO RELATED APPLICATIONS

This application is a divisional of U.S. patent application Ser. No. 11/414,521, filed Apr. 28, 2006, incorporated by reference herein.

FIELD OF THE INVENTION

The present invention is related to techniques for clock and data recovery in a communication system and, more particularly, to techniques for processing an integral register in a digital loop filter.

BACKGROUND OF THE INVENTION

Digital communication receivers sample an incoming waveform and then reliably detect the sampled data. Typically, a receiver includes a Clock and Data Recovery (CDR) system to recover the clock and data from an incoming data stream. The CDR system generates a clock signal having the same frequency and phase as the incoming signal, which is then used to sample the received signal and detect the transmitted data.

CDR systems often employ well-known multiple stage proportional-integral (PT) digital loop filters, typically having multiple integrators in series. In a second order filter, for example, the first integrator includes a proportional register (PREG), and the second integrator includes an integral register (IREG), in a known manner. The CDR system recovers or locks to an initially unknown phase offset and frequency offset present in the incoming signal. The integral state of the loop is directly related to the frequency offset. The integral register is typically initialized to a value of zero (0) and the integral register value will eventually converge to a value that is proportional to the frequency offset.

While existing CDR systems perform well for a reasonable chip area and power budget, a need exists for techniques to enhance the performance of such CDR systems. A further need exists for techniques for monitoring the quality of the performance of the CDR system for staying locked to the correct frequency.

SUMMARY OF THE INVENTION

Generally, methods and apparatus are provided for improving the performance of second order CDR systems. According to one aspect of the invention, the integral state of the CDR system is initialized to a value that is based on an expected frequency profile that may be known a priori for certain applications. An expected frequency offset profile is determined between a received signal and a local clock generated by the CDR system; and the integral register is initialized based on the expected frequency offset profile. In one exemplary implementation, an arithmetic mean is applied to minimum and maximum frequency excursions of the expected frequency offset profile to obtain an initialization value.

According to another aspect of the invention, one or more quality of lock (QOL) metrics are monitored that are derived from the integral register state value. A quality of a locking between a received signal and a local clock generated by a Clock and Data Recovery (CDR) system is evaluated by monitoring a state value of an integral register in a digital loop filter of the CDR system; evaluating one or more predefined criteria based on the integral register state value; and identifying a poor lock condition if the one or more predefined criteria are not satisfied. The disclosed quality-of-lock metrics thus allow a poor lock quality to be detected.

The predefined criteria for the quality of lock can comprise, for example, one or more of (i) a threshold for a maximum deviation of the state value across a time window; (ii) a threshold for a mean squared error between an expected frequency profile and a time-aligned version of the state values; (iii) a threshold for an absolute value criterion of an error between an expected frequency profile and a time-aligned version of the state values; and (iv) a threshold for a maximum deviation of the state value across a time window.

A more complete understanding of the present invention, as well as further features and advantages of the present invention, will be obtained by reference to the following detailed description and drawings.

DETAILED DESCRIPTION

The present invention provides methods and apparatus for improving the performance of second order CDR systems. According to a first aspect of the invention, the integral state of the CDR system is initialized to a value that is based on an expected frequency profile that may be known a priori for certain applications. The disclosed CDR state initialization techniques improve jitter tolerance of the CDR system by reducing the maximum frequency offset to be acquired by the CDR.

According to another aspect of the invention, one or more quality of lock (QOL) metrics are monitored that are derived from the integral register state value. The quality-of-lock metrics allow a poor lock quality to be detected. In this manner, the system throughput can be improved by signaling to an external environment that a CDR lock issue exists or by re-initiating the acquisition/gear shifting process. As discussed hereinafter, the gear shifting process determines the gain parameters ($i_g$ and $p_g$) for the integral and proportional paths, respectively, in the second order CDR system. In some cases, the quality of lock condition might be detected before bit errors are produced on the recovered data. In one exemplary embodiment, the quality of lock metrics are layered in terms of complexity so various tradeoffs of criterion versus area/power can be balanced for different applications. For example, among the exemplary QOL criteria described herein, a decimated version of the maximum deviation criterion can be implemented with relatively low complexity while the mean square criterion requires more complexity.

Figure 1:
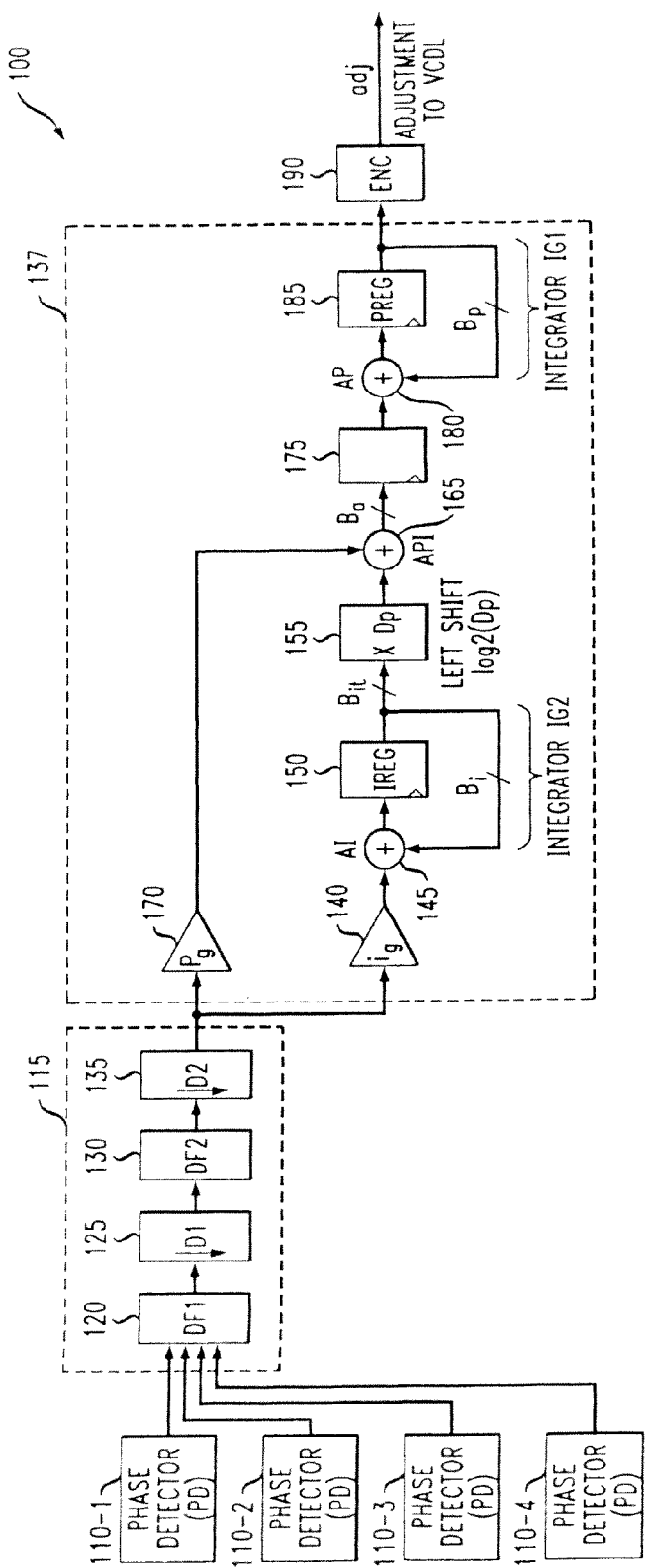
FIG. 1 is a block diagram of a second order parallel sampled decimated CDR loop filter in which the present invention can be applied.

FIG. 1 is a block diagram of a second order parallel sampled decimated CDR loop filter 100. For a detailed description of an exemplary multi-stage decimated CDR loop filter 100, see, for example, U.S. patent application Ser. No. 10/965,138, filed Oct. 14, 2004, entitled "Parallel Sampled Multi Stage Decimated Digital Loop Filter for Clock/Data Recovery," incorporated by reference herein.

As shown in FIG. 1, the exemplary multi-stage decimated CDR loop filter 100 includes four phase detectors 110-1 through 110-4 (hereinafter, collectively referred to as phase detectors 110). The outputs of the phase detectors 110 are combined by means of an exemplary two-stage decimation and downsampling filter 115. The exemplary decimation and downsampling filter 115 comprises a first stage decimation filter (DF1) 120 and a first stage downsampling factor 125. The first stage decimation filter (DF1) 120 can be of any length or form (such as Finite Impulse Response/Infinite Impulse Response (FIR/IIR) filters), as apparent to a person of ordinary skill in the art. The output of the first stage decimation filter 120 output is downsampled at stage 125 by a factor of D1. The second stage decimation filter 130 is denoted as DF2 and the second stage downsampling factor 135 is denoted as D2. Alternative embodiments of the invention may employ any number of decimation stages. The output of the exemplary two-stage decimation and downsampling filter 115 is processed by a loop filter 137. The loop filter 137 operates at 1/Dth of the full data rate where D is the aggregate decimation factor. In the exemplary embodiment shown in FIG. 1, the aggregate decimation factor is D equal to D1×D2.

As shown in FIG. 1, the loop filter 137 is embodied as a second order, digital loop filter comprised of two sub-filters, namely, the integrators IG1 and IG2. A "proportional" path is comprised of a loop gain stage 170 having a gain of $p_g$ that is applied to an adder 165. A "second order" or integral path is comprised of a loop gain stage 140 having a gain of $i_g$ that is applied to the integrator IG2 and then shifted at stage 155 by a factor of $D_p$. The output of stage 155 is applied to the adder 165. The output of the adder is latched by a register 175 and then processed by the second sub-filter IG1. The output of the second sub-filter IG1 is then encoded by an encoding block 190 to generate an adjustment for the phase of the VCDL (not shown).

The integrators IG1 and IG2 each comprise an adder AP or AI and a register PREG or IREG. As previously indicated, the integral register 150 is typically initialized to a value of zero (0) and the integral register value will eventually converge to a value that is proportional to the frequency offset. The integral state is represented by the integral register 150. In fixed point arithmetic, the width of the integral register 150 is $B_i$ bits in maintaining the integral state information. However, only the most significant bits (MSBs) or top $B_{it}$ bits may be used to drive the rest of the CDR circuit.

Integral Register State Initialization

As indicated above, a first aspect of the invention initializes the integral state of the CDR system, and in particular the integral register 150, to a value that is based on an expected frequency profile that may be known apriori for certain applications. In certain communications applications, the frequency offset between the received signal and the locally generated clock may remain fixed but unknown. In other applications, the frequency offset may be varying but vary according to a known profile (although the initial value could be anywhere in the profile). Moreover, the profile might vary such that it varies across only one polarity of the frequency offset.

Figure 2:
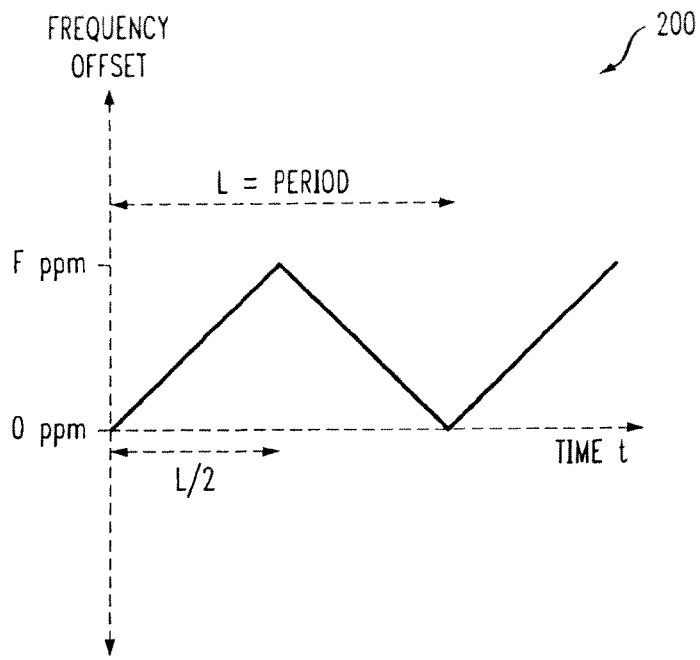
FIG. 2 illustrates an exemplary triangular frequency offset sweep profile.

When the frequency offset is fixed but not known, the integral register 150 is typically initialized to a zero value corresponding to a zero frequency offset. However, if the profile for a given application is known and varies over only one polarity, the integral register 150 may be initialized to a non-zero value which would improve the jitter tolerance performance of the CDR. For example, consider the periodic frequency offset sweep profile represented by f(t) and shown in FIG. 2. FIG. 2 illustrates an exemplary triangular frequency offset sweep profile 200. As shown in FIG. 2, the frequency offset over a period L between a minimum value of 0 parts-per-million (ppm) and a maximum value of F ppm.

Mathematically, the frequency offset, f(t), can be expressed as:

$$\text{For } 0 < t < \frac{L}{2}, f(t) = \frac{F}{L/2}t \quad (1)$$

$$\text{For } \frac{L}{2} < t < L, f(t) = -\frac{F}{L/2}t + F \quad (2)$$

Where F is the maximum frequency offset excursion in ppm and L is the period of the profile in bit times. The frequency offset profile 200 shown in FIG. 2 is often used in serial ATA (SATA) spread spectrum clock based applications. Consider the arithmetic mean, $f_m$, of the minimum and maximum frequency excursions:

$$f_m = \frac{1}{2}(f(L/2) - f(0)) \quad (3)$$

In one embodiment, the integral register 150 is initialized to a value IREGINIT that is equal to the arithmetic mean, $f_m$. Intuitively, this is beneficial since, on average, the CDR may have to acquire only half of the total frequency offset variation.

Suppose F is equal to 6000 ppm and now consider, for example, that the actual initial frequency offset was 6000 ppm. If the integral register 150 is initialized to a value IREGINIT of 0 ppm, the CDR would have to acquire 6000 ppm. However, when the initialization value, IREGINIT, is set to the mean of the minimum and maximum frequency excursion, the maximum offset to be acquired is only 3000 ppm. This example assumes that the initial frequency offset was equally likely across the profile variation. If any physical phenomenon dictated otherwise, the criterion for calculating IREGINIT could be appropriately modified to reflect such unequal probabilities, as would be apparent to a person of ordinary skill in the art.

Generally, in accordance with the present invention, the integral register 150 is initialized to a value IREGINIT that is based on the expected frequency offset profile. A mathematical operator, such as an exemplary arithmetic mean, is applied to the minimum and maximum frequency excursions of the expected frequency offset profile. Additional operators could be employed, as would be apparent to a person of ordinary skill in the art.

Quality of Lock Monitoring

As indicated above, a second aspect of the invention monitors one or more quality of lock (QOL) metrics that are based on the state value of the integral register 150. Generally, the disclosed quality of lock metrics allow a poor lock quality to be detected. In this manner, the system throughput can be improved by signaling to an external environment that a CDR lock issue exists or by re-initiating the acquisition/gear shifting process.

Generally, the second aspect of the present invention recognizes that the integral register 150 should behave in a defined way. The disclosed quality of lock metrics provide predefined criteria for monitoring the behavior of the integral register 150. If the integral register 150 deviates from one or more predefined quality of lock metrics, then a poor locking condition can be detected.

Figure 3:
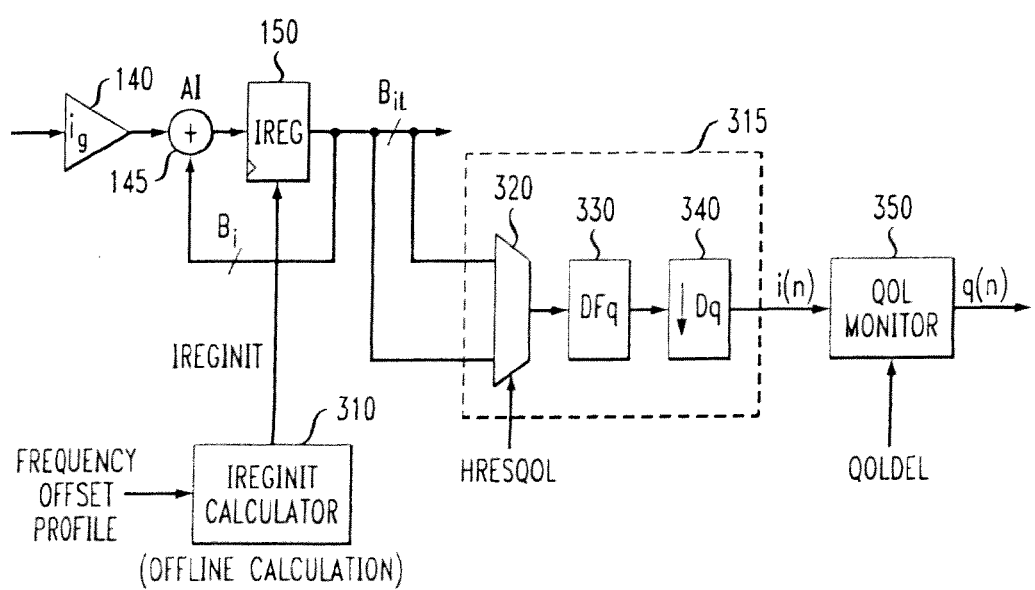
FIG. 3 is a block diagram illustrating the operation of the integral register of FIG. 1 in further detail, in accordance with the present invention.

FIG. 3 is a block diagram illustrating the operation of the integral register 150 of FIG. 1 in further detail, in accordance with the present invention. As shown in FIG. 3, a calculator 310 calculates the initialization value, IREGINIT, in the manner described above. The remaining aspects of FIG. 3, discussed hereinafter, are related to the quality of lock metrics aspect of the invention.

As shown in FIG. 3, before the QOL metrics are calculated, a pre-processor 315 can optionally perform some QOL pre-processing steps to simplify one or more of the computations. First, a multiplexer 320 can select between the full resolution IREG value or the MSBs of the IREG register 150, based on the programmable selection of HRESQOL (high resolution QOL) to be a binary value of 1 or 0. In addition, the pre-processor 315 can optionally filter the high (or low) resolution IREG value with a QOL decimation filter DFq 330 and down-sample the filtered value at stage 340 to a further lower rate by a factor of Dq below the rate at which the integral register 150 operates. Let i(n) represent the numerical value of the pre-processed integral register 150 (i.e., with any optional QOL decimation filtering/downsampling and retention of only the MSBs).

Three exemplary QOL metric criteria are discussed hereinafter that indicate whether or not a "good" lock still exists. Generally, the first two criterion determine whether a good lock was maintained after an initial lock which is assumed to take no longer than a delay period of QOLDEL bits (determined by the CDR design). Thus, the QOL monitoring for these two criteria is activated after a delay of QOLDEL bits. The third criterion can be used when a frequency sweep profile is known and can determine whether an initial lock has occurred or any deviation from lock after initial lock.

Let q(n) be a variable that is initialized to 0. If q(n) becomes 1, the quality of lock is no longer good.

A. Maximum Deviation Across a Programmable Time Window

The first exemplary criterion considers the maximum deviation of the pre-processed IREG value i(n) across a programmable time window of K bits. Let the deviation of i(n) at a given time be expressed as:

$$v(n) = i(n) - i(n-K) \quad (4)$$

Based on this criterion, the QOL metric is defined as follows:

$$q(n) = \begin{cases} 1 & \text{if } v(n) > v_T \text{ or } v(n) < -v_T \\ 0 & \text{otherwise} \end{cases} \quad (5)$$

Thus, when the absolute deviation exceeds the threshold, $v_T$, a poor lock condition is declared. Upon detection of a poor lock condition, the QOL monitor 350 (FIG. 3) can (i) send a bad QOL flag to the external environment without further intervention or (ii) initiate the CDR to re-start the phase/frequency acquisition process and/or any gear shifting of the loop gains $p_g$ and $i_g$ shown in FIG. 1. The parameters K and $v_t$ would be optimized for a given application. For the first criterion, the optional use of high or low resolution IREG values and/or QOL decimation filtering/downsampling would be based on trading off accuracy/speed of QOL detection with area/power of the QOL monitoring. This criterion can be used for any frequency profile.

Figure 4:
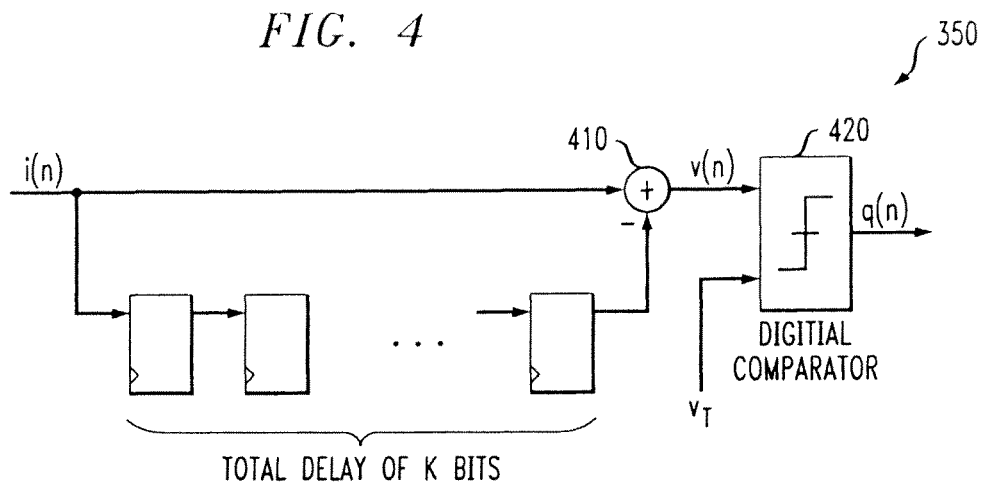
FIG. 4 is a block diagram of the QOL monitor of FIG. 3 for the calculation of q(n) in accordance with a first and second exemplary criterion.

FIG. 4 is a block diagram of the QOL monitor 350 of FIG. 3 for the calculation of q(n) in accordance with the first exemplary criterion. As shown in FIG. 4, the pre-processed IREG value i(n) is applied to an adder 410, and an inverted version of i(n) that has been delayed by K bits is also applied to the adder 410, in order to implement equation (4). A digital comparator 420 compares the computed value v(n) to the threshold, $v_T$.

B. Running Mean Deviation

The second exemplary criterion monitors the deviation of the pre-processed running mean for a more reliable calculation, instead of examining the pre-processed IREG deviation directly. The second exemplary criterion, however, is limited to a frequency offset profile where the frequency offset is fixed. Let the running mean be expressed as follows:

$$i_m(n) = \sum_{n=K1}^{K2} i(n) \quad (6)$$

the QOL flag is determined in the manner described above (equation (5)) except that v(n) is defined based on $i_m(n)$ instead of i(n). The block diagram of FIG. 4 can be modified to reflect this additional accumulation to compute the running mean, as would be apparent to a person of ordinary skill in the art.

C. Mean Squared/Absolute Value Error Criterion

The third exemplary criterion examines the long term behavior of the integral state/register, not only deviations from a prior value. This is possible for applications where the frequency offset profile is a priori known. In particular, if the frequency offset profile is periodic, as considered earlier, it is more amenable to use this criterion. Other than a delay/scale factor, the IREG 150 will follow the same profile as the frequency profile. Let $f_q(n)$ represent the sampled frequency sweep profile scaled to the corresponding fixed point IREG values. Let $i_a(n)$ represent the pre-processed IREG value that has been time aligned to the expected profile, $f_q(n)$, over one period. Then, a mean squared frequency error, $f_e$, criterion is expressed as:

$$f_e(n) = \sum_{n=L1}^{L2} (f_q(n) - i_a(n))^2 \quad (7)$$

Alternatively, an absolute value criterion can be considered:

$$f_e(n) = \sum_{n=L1}^{L2} (|f_q(n) - i_a(n)|)^2 \quad (8)$$

In these cases, $$q(n) = \begin{cases} 1 & \text{if } f_e(n) > e_T \\ 0 & \text{otherwise} \end{cases} \quad (9)$$

where $e_T$ is an error threshold defined appropriately for either the mean square or absolute value error criterion.

Figure 5:
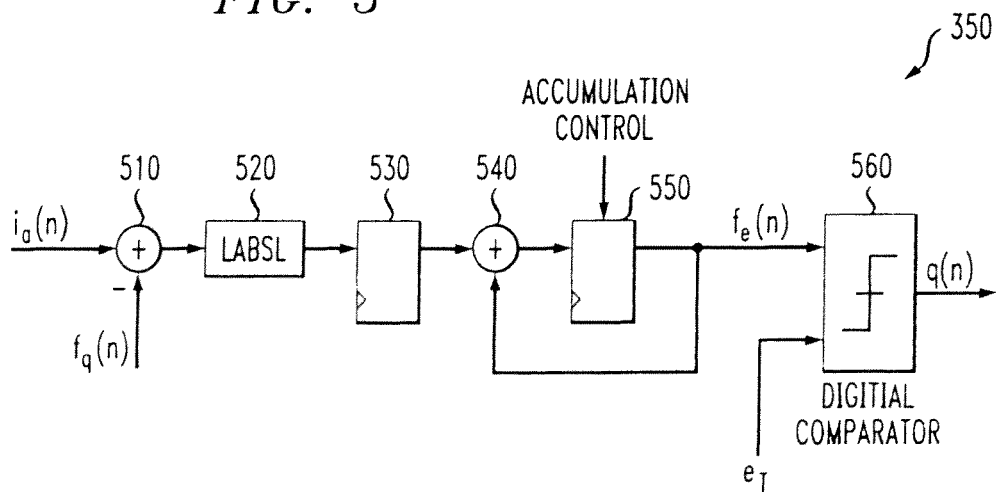
FIG. 5 is a block diagram of the QOL monitor of FIG. 3 for the calculation of q(n) in accordance with a third exemplary criterion.

FIG. 5 is a block diagram of the QOL monitor 350 of FIG. 3 for the calculation of q(n) in accordance with the third exemplary criterion. As shown in FIG. 5, the pre-processed IREG value, $i_a(n)$, that has been time aligned to the expected profile, $f_q(n)$, is applied to an adder 510 with an inverted version of the expected profile, $f_q(n)$, to obtain the difference value required by equation (8). The absolute value is obtained at stage 520 and latched at stage 530. The sum over $L_1$ to $L_2$ is obtained using an adder 540 and a register 550, based on an applied accumulation control signal. A digital comparator 560 compares the computed value $f_e(n)$ to the threshold, $e_T$.

While exemplary embodiments of the present invention have been described with respect to digital logic blocks, as would be apparent to one skilled in the art, various functions may be implemented in the digital domain as processing steps in a software program, in hardware by circuit elements or state machines, or in combination of both software and hardware. Such software may be employed in, for example, a digital signal processor, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits.

It is to be understood that the embodiments and variations shown and described herein are merely illustrative of the principles of this invention and that various modifications may be implemented by those skilled in the art without departing from the scope and spirit of the invention.

We claim:

1. A method for evaluating a quality of a locking between a received signal and a local clock generated by a Clock and Data Recovery (CDR) system, comprising:
    monitoring a state value of an integral register in a digital loop filter of said CDR system;
    evaluating one or more predefined criteria based on said integral register state value, wherein said one or more predefined criteria is based on a deviation of said state value within a predefined time window; and
    identifying a poor lock condition if said one or more predefined criteria are not satisfied.

2. The method of claim 1, wherein said one or more predefined criteria comprise a threshold for a maximum deviation of said state value across said predefined time window.

3. The method of claim 1, wherein said one or more predefined criteria comprise a threshold for a mean squared error within said predefined time window between an expected frequency profile and a time-aligned version of said state values.

4. The method of claim 1, wherein said one or more predefined criteria comprise a threshold for an absolute value criterion of an error within said predefined time window between an expected frequency profile and a time-aligned version of said state values.

5. The method of claim 1, wherein said evaluating step is performed after a predefined time period during which said CDR system is expected to lock.

6. The method of claim 1, further comprising the step of selecting between a full resolution value and the most significant bits of said integral register.

7. The method of claim 1, further comprising the step of filtering said integral register value with a decimation filter.

8. The method of claim 1, further comprising the step of downsampling said integral register value to a rate below the rate of said integral register.

9. A system for evaluating a quality of a locking between a received signal and a local clock generated by a Clock and Data Recovery (CDR) system, comprising:
    a quality of lock monitor configured to:
        monitor a state value of an integral register in a digital loop filter of said CDR system;
        evaluate one or more predefined criteria based on said integral register state value, wherein said one or more predefined criteria is based on a deviation of said state value within a predefined time window; and
        identify a poor lock condition if said one or more predefined criteria are not satisfied.

10. The system of claim 9, wherein said one or more predefined criteria comprise a threshold for a maximum deviation of said state value across said predefined time window.

11. The system of claim 9, wherein said one or more predefined criteria comprise a threshold for a mean squared error within said predefined time window between an expected frequency profile and a time-aligned version of said state values.

12. The system of claim 9, wherein said one or more predefined criteria comprise a threshold for an absolute value criterion of an error within said predefined time window between an expected frequency profile and a time-aligned version of said state values.

13. The system of claim 9, wherein said quality of lock monitor is further configured to perform said evaluation after a predefined time period during which said CDR system is expected to lock.

14. The system of claim 9, wherein said quality of lock monitor is further configured to select between a full resolution value and the most significant bits of said integral register.

15. The system of claim 9, further comprising a decimation filter to filter said integral register value.

16. The system of claim 9, wherein said integral register value is downsampled to a rate below the rate of said integral register.

* * * * *